United States Patent
Shin et al.

(10) Patent No.: US 9,942,985 B2
(45) Date of Patent: Apr. 10, 2018

(54) PRINTED CIRCUIT BOARD AND METHOD OF FABRICATING THE SAME

(71) Applicant: LG INNOTEK CO., LTD., Seoul (KR)

(72) Inventors: Seung Yul Shin, Seoul (KR); Jae Hwa Kim, Seoul (KR); Chung Sik Park, Seoul (KR); Chul Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 156 days.

(21) Appl. No.: 14/627,319

(22) Filed: Feb. 20, 2015

(65) Prior Publication Data

US 2015/0245486 A1    Aug. 27, 2015

(30) Foreign Application Priority Data

Feb. 21, 2014   (KR) .................. 10-2014-0020572

(51) Int. Cl.

| H05K 7/00 | (2006.01) |
|---|---|
| H05K 1/11 | (2006.01) |
| H05K 1/02 | (2006.01) |
| H05K 1/18 | (2006.01) |
| H05K 3/00 | (2006.01) |

(Continued)

(52) U.S. Cl.
CPC .......... H05K 1/115 (2013.01); H01L 23/3677 (2013.01); H01L 23/49822 (2013.01); H01L 23/5389 (2013.01); H05K 1/0204 (2013.01); H05K 1/0206 (2013.01); H05K 1/0298 (2013.01); H05K 1/181 (2013.01); H05K 3/0094 (2013.01); *H01L 2224/16237* (2013.01); *H01L 2224/73204* (2013.01); *H01L 2924/15313* (2013.01); *H05K 1/185* (2013.01); *H05K 3/4602* (2013.01); *H05K 2201/096* (2013.01);

(Continued)

(58) Field of Classification Search
CPC ........ H05K 1/115; H05K 1/165; H05K 1/185; H05K 1/111–1/112; H05K 3/3436; H05K 3/3452; H01L 2924/01078–2924/01079
USPC .......... 361/760–764, 792–795; 174/258–268
See application file for complete search history.

(56) References Cited

U.S. PATENT DOCUMENTS

| 8,003,896 B2 * | 8/2011 | Wu ........................ H05K 1/115 |
| | | 174/260 |
| 8,242,379 B2 * | 8/2012 | Ikeda .................. H01L 21/4857 |
| | | 174/261 |

(Continued)

FOREIGN PATENT DOCUMENTS

| EP | 1 261 028 A2 | 11/2002 |
| EP | 2 227 076 A1 | 9/2010 |
| WO | WO 00/69236 A1 | 11/2000 |

OTHER PUBLICATIONS

European Search Report dated Jan. 7, 2016 issued in Application No. 15155834.3.

*Primary Examiner* — Tuan T Dinh
(74) *Attorney, Agent, or Firm* — KED & Associates, LLP

(57) ABSTRACT

Disclosed is a printed circuit board including a base insulating layer, an upper insulating layer formed on the base insulating layer, a lower insulating layer formed under the base insulating layer. The upper insulating layer has a plurality of first vias filled in the first through holes, respectively, and the lower insulating layer has a second via filled in one second through hole formed through a top and a bottom surface and commonly connected with the first vias.

8 Claims, 11 Drawing Sheets

(51) Int. Cl.
*H01L 23/367* (2006.01)
*H01L 23/498* (2006.01)
*H01L 23/538* (2006.01)
*H05K 3/46* (2006.01)

(52) U.S. Cl.
CPC .............. *H05K 2201/09536* (2013.01); *H05K 2201/09845* (2013.01)

(56) References Cited

U.S. PATENT DOCUMENTS

| | | | |
|---|---|---|---|
| 8,981,558 B2* | 3/2015 | Ide | H01L 23/498 257/737 |
| 9,337,139 B2* | 5/2016 | Kitano | H01L 23/5223 |
| 9,411,015 B2* | 8/2016 | Yokou | G01R 31/3187 |
| 2003/0002260 A1 | 1/2003 | Hasebe et al. | |
| 2007/0256858 A1* | 11/2007 | Kariya | H01L 21/4857 174/260 |
| 2010/0200277 A1 | 8/2010 | Huang et al. | |
| 2011/0084385 A1* | 4/2011 | Itaya | H01L 21/563 257/737 |
| 2011/0220399 A1* | 9/2011 | Niki | H05K 1/115 174/258 |
| 2012/0212919 A1* | 8/2012 | Mano | H05K 1/185 361/782 |
| 2012/0261166 A1 | 10/2012 | Oh et al. | |
| 2013/0333934 A1* | 12/2013 | Hurwitz | H01L 23/3677 174/262 |
| 2014/0020940 A1* | 1/2014 | Mano | H05K 1/165 174/258 |
| 2014/0048313 A1 | 2/2014 | Pan et al. | |

* cited by examiner

PRINTED CIRCUIT BOARD AND METHOD OF FABRICATING THE SAME

CROSS-REFERENCE TO RELATED APPLICATION

This application claims priority under 35 U.S.C. § 119 to Korean Application No. 10-2014-0020572 filed on Feb. 21, 2014, whose entire disclosure is incorporated herein by reference.

BACKGROUND

1. Field

The present application relates to a printed circuit board and a method of fabricating the same.

2. Background

With the advance of a semiconductor or an electronic device, the printed circuit board has solidified the position thereof as one of electronic components. The printed circuit board has been extensively used as a component to realize circuits all electrical and electronic devices from an electronic product to high-tech electronic equipment including a computer.

The printed circuit board is provided in the form of a package having a core structure. For example, a flip-chip chip scale package (FCCSP) product is focused on realizing a fine circuit while enhancing a current signal transmission rate.

FIG. 1 is a sectional view showing a printed circuit board according to the relates art.

Referring to FIG. 1, the printed circuit board includes a first insulating layer 10, a first pattern 12, a second pattern 14, a first via 16, a second insulating layer 20, a third pattern 22, a second via 26, a third insulating layer 30, a fourth pattern 32, a third via 36, a protective layer 40, an electronic device 50, a connection part 55 and a molding part 60.

The first insulating layer 10 serves as a core layer and is provided therein with the first via 16. In this case, the first insulating layer 10 may include a plurality of layers. The first insulating layer 10 is provided on a top surface thereof with the first pattern 12, and on a bottom surface thereof with the second pattern 14.

Second insulating layers 20 are formed at upper and lower portions of the first insulating layer 10, respectively, to cover the surface of the first insulating layer 10 and the first pattern 12 or the second pattern 14.

In addition, the second insulating layer 20 is provided therein with the second via 26. In addition, the second insulating layer 20 is provided on the surface thereof with the third pattern 220.

Third insulating layers 30 are formed on the second insulating layer 20 formed at the upper portion of the first insulating layer 10 and under the second insulating layer 20 formed at the lower portion of the first insulating layer 10.

In addition, the third insulating layer 30 is formed on the surface thereof with the fourth pattern 32 and formed therein with the third via 36.

In addition, the protective layer 40 is formed to cover the surface of the third insulating layer 30 and a portion of the surface of the fourth pattern 32.

The electronic device 50 is attached onto the upper third insulating layer 30. The electronic device 50 is electrically connected with the fourth pattern 32 through the connection part 55. In addition, the molding part 60 is formed to cover the connection part 55 of the electronic device 50 and a portion of the surface of the electronic device 50.

The printed circuit board having the above structure is designed while focusing on realizing a fine circuit while enhancing a current signal transmission rate. Accordingly, vias included in the printed circuit board have widths in the range of about 50 µm to about 70 µm in order to realize fine pitches.

However, according the printed circuit board, since the size of the vias required to realize the fine pitches is limited, a heat radiation characteristic may be remarkably degraded.

BRIEF DESCRIPTION OF THE DRAWINGS

The embodiments will be described in detail with reference to the following drawings in which like reference numerals refer to like elements wherein.

DETAILED DESCRIPTION

Figure 1:
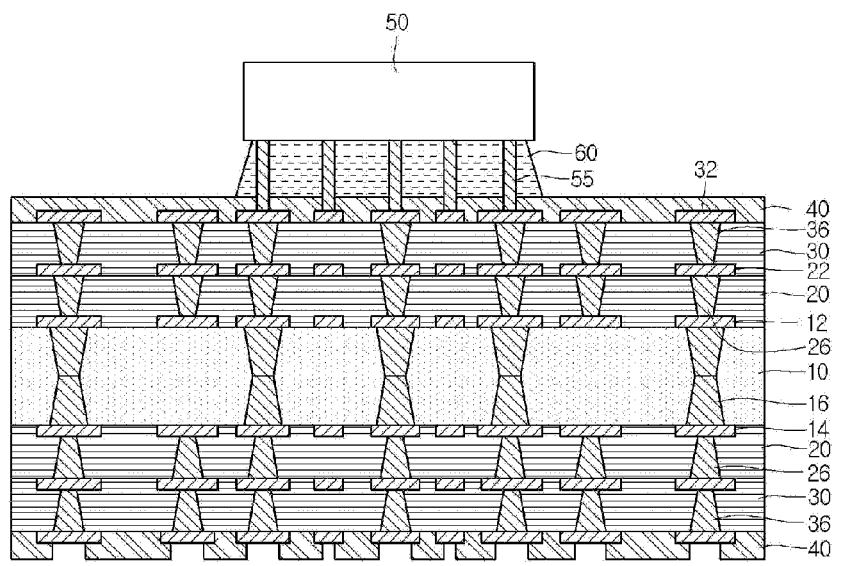
FIG. 1 is a sectional view showing a printed circuit board according to the related art.

Hereinafter, embodiments will be described in detail with reference to accompanying drawings so that those skilled in the art can easily work with the embodiments. However, the embodiments may not be limited to those described below, but have various modifications. In addition, only components related to the embodiment are shown in drawings for the clarity of explanation. Hereinafter, the similar reference numerals will be assigned to the similar elements.

In the following description, when a predetermined part "includes" a predetermined component, the predetermined part does not exclude other components, but may further include other components unless otherwise indicated.

The thickness and size of each layer shown in the drawings may be exaggerated, omitted or schematically drawn for the purpose of convenience or clarity. In addition, the size of elements does not utterly reflect an actual size.

In the following description of the embodiments, it will be understood that, when a layer, a film, a region, or a plate is referred to as being "on" or "under" another layer, another film, another region, or another plate, it can be "directly" or "indirectly" on the other layer, film, region, or plate, or one or more intervening layers may also be present. Such a position of the layer has been described with reference to the drawings.

Figure 2:
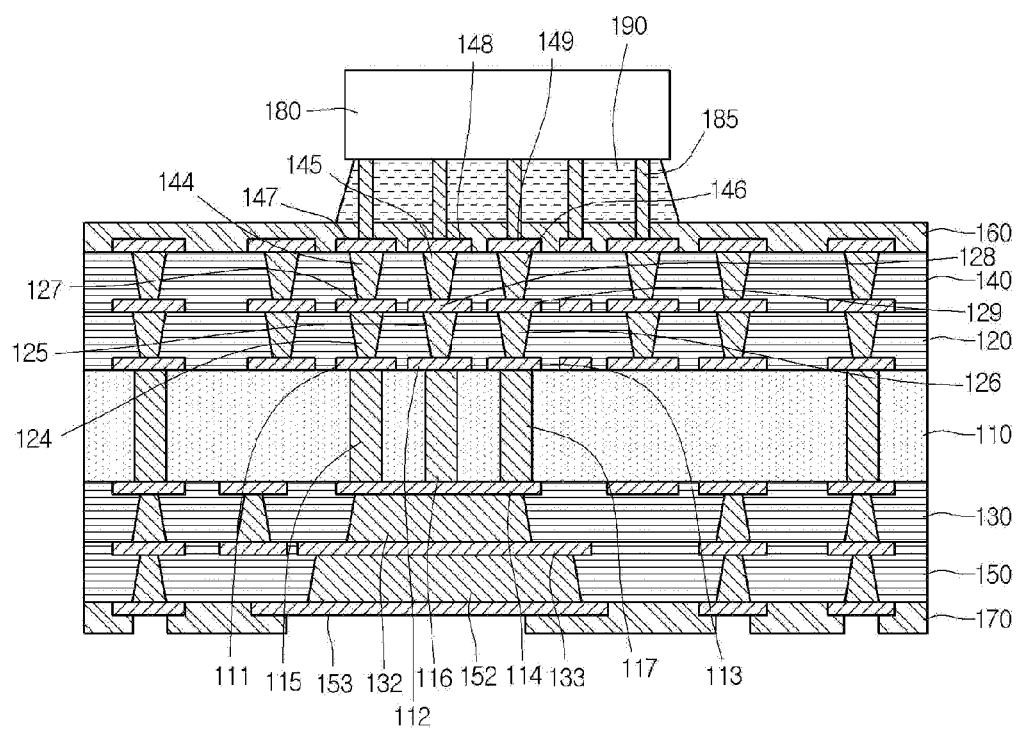
FIG. 2 is a sectional view showing the structure of the printed circuit board according to a first embodiment.

FIG. 2 is a sectional view showing the structure of a printed circuit board according to a first embodiment.

Referring to FIG. 2, the printed circuit board includes insulating layers 110, 120, 130, 140, and 150, vias 115, 116, 117, 124, 125, 126, 144, 145, 146, 132, and 152, circuit patterns 111, 112, 113, 114, 127, 128, 129, 147, 148, 149, 133, and 153, a protective layer 160, an electronic device 180, a connection part 185, and a molding layer 190.

The first insulating layer 110, the second insulating layer 120, the third insulating layer 130, the fourth insulating layer 140, and the fifth insulating layer 150 may include an insulating plate, and may include a thermosetting or thermoplastic polymeric substrate, a ceramic substrate, an organic-inorganic composite material substrate, or a glass fiber impregnated substrate. If the insulating layers include the polymeric resin, the insulating layers may include epoxy insulating resin, such as FR-4, Bismaleimide Triazine (BT), or Ajinomoto Build up Film (ABF). Alternatively, the insulating layers may include polyimide based resin, but the embodiment is not limited thereto.

The first insulating layer 110, the second insulating layer 120, the third insulating layer 130, the fourth insulating layer 140, and the fifth insulating layer 150 may include the same material, and preferably includes an insulating sheet formed of only resin.

In addition, the first insulating layer 110 may be a core substrate. The second insulating layer 120, the third insulating layer 130, the fourth insulating layer 140, and the fifth insulating layer 150 other than the first insulating layer 110 may include an insulating sheet formed of only resin.

The first insulating layer 110 is a base insulating layer. The base insulating layer may refer to an insulating layer provided at the center of the lamination structure of the first insulating layer 110, the second insulating layer 120, the third insulating layer 130, the fourth insulating layer 140, and the fifth insulating layer 150, and may refer to an insulating layer which is first formed in the fabrication process.

The circuit patterns 111, 112, 113, 114, 127, 128, 129, 147, 148, 149, 133, and 153 are formed on the surfaces of the insulating layers 110, 120, 130, 140, and 150.

The circuit patterns 111, 112, 113, 114, 127, 128, 129, 147, 148, 149, 133, and 153 may be connected with the vias 115, 116, 117, 124, 125, 126, 144, 145, 146, 132, and 152.

The circuit patterns 111, 112, 113, 114, 127, 128, 129, 147, 148, 149, 133, and 153 may be formed through typical processes, such as an additive process, a subtractive process, a modified semi-additive process (MSAP), and a semi-additive process, of fabricating the printed circuit board, and the details thereof will be omitted.

The circuit patterns 111, 112, 113, 114, 127, 128, 129, 147, 148, 149, 133, and 153 may have mutually different widths varying depending on positions where the circuit patterns 111, 112, 113, 114, 127, 128, 129, 147, 148, 149, 133, and 153 are formed.

Preferably, the circuit patterns 111, 112, 113, 127, 128, 129, 147, 148, and 149 formed on the first insulating layer 110 may have a first width, and the circuit patterns 114, 133, and 153 formed under the first insulating layer 110 may have a second width wider than the first width.

This is because the circuit patterns 111, 112, 113, 127, 128, 129, 147, 148, and 149 formed on the first insulating layer 110 may have functions different from those of the circuit patterns 114, 133, and 153 formed under the first insulating layer 110. Alternatively, this is because the circuit patterns must make efficiencies different from each other.

In other words, the circuit patterns 111, 112, 113, 127, 128, 129, 147, 148, and 149 formed on the first insulating layer 110 have the first width in order to realize the fine pitches while enhancing the efficiency of an electrical signal transmission rate.

In addition, the circuit patterns 114, 133, and 153 formed under the first insulating layer 110 have a second width wider than the first width in order to enhance heat radiation efficiency.

The vias 115, 116, 117, 124, 125, 126, 144, 145, 146, 132, and 152 are formed through the insulating layers 110, 120, 130, 140, and 150.

The vias 115, 116, 117, 124, 125, 126, 144, 145, 146, 132, and 152 formed through the insulating layers 110, 120, 130, 140, and 150 are connected with the circuit patterns formed on the surfaces of the relevant insulating layers.

The vias 115, 116, 117, 124, 125, 126, 144, 145, 146, 132, and 152 may be formed through any one of an electroless plating scheme, an electrolytic plating scheme, a screen printing scheme, a sputtering scheme, an evaporation scheme, an injecting scheme, and a dispensing scheme or the combination thereof using any one selected among Cu, Ag, Sn, Au, Ni and Pd.

Similarly to the circuit patterns 111, 112, 113, 114, 127, 128, 129, 147, 148, 149, 133, and 153, the vias 115, 116, 117, 124, 125, 126, 144, 145, 146, 132, and 152 may have mutually different widths depending on positions where the vias 115, 116, 117, 124, 125, 126, 144, 145, 146, 132, and 152 are formed.

In other words, the vias 124, 125, 126, 144, 145, and 146 formed above the first insulating layer 110 and the vias 115, 116, and 117 formed in the first insulating layer 110 have a third width, and the vias 132 and 152 formed under the first insulating layer 110 have a fourth width wider than the third width.

The first insulating layer 110 is formed therein with the first via 115, the second via 116, and the third via 117.

In addition, the second insulating layer 120 is formed therein with the fourth via 124, the fifth via 125, and the sixth via 126.

In addition, the fourth insulating layer 140 is formed therein with the seventh via 144, the eighth via 145, and the ninth via 146.

In addition, the first via 115 is vertically aligned in line with the fourth via 124 and the seventh via 144, so that the first via 115, the fourth via 124 and the seventh via 144 are connected together through the circuit patterns 111, 127, and 147.

Further, the second via 116 is vertically aligned in line with the fifth via 125 and the eighth via 145, so that the second via 116, the fifth via 126, and the eighth via 145 are connected together through the circuit patterns 112, 128, and 146.

In addition, the third via 117 is vertically aligned in line with the sixth via 126 and the ninth via 146, so that the third via 116, the sixth via 126, and the ninth via 146 are connected together through the circuit patterns 113, 129, and 149.

Meanwhile, the vias 115, 116, 117, 124, 125, 126, 144, 145, and 146 formed in the first insulating layer 110 and on the first insulating layer 110 may have the same third width as described above.

Meanwhile, the vias formed in the same insulating layer are spaced apart from each other by a predetermined distance.

For example, the first via 115, the second via 116, and the third via 117 formed in the first insulating layer 110 are spaced apart from each other by a uniform distance.

Meanwhile, the vias 132 and 152 formed under the first insulating layer 110 have the fourth width wider than the third width.

The via 152 formed in the fifth insulating layer 150 has a width wider than that of a via formed in the third insulating layer 130, so that the vias 152 and 132 may be formed in a pyramid shape.

In this case, the via 132 formed in the third insulating layer 130 is commonly connected with a plurality of vias formed at a plurality of upper layers.

In other words, the via 132 formed in the third insulating layer 130 is commonly connected with the vias 115, 116, and 117 formed in the first insulating layer 110. Accordingly, the width of the via 132 formed in the third insulating layer 130 is wider than at least the sum of widths of the vias 115, 116, and 117 formed in the first insulating layer 116.

Meanwhile, a top surface of the via formed in the third insulating layer 130 is connected with a bottom surface of the circuit pattern 114 formed on a bottom surface of the first insulating layer 110. In addition, a top surface of the circuit pattern 114 is commonly connected with a bottom surface of the first via 115, a bottom surface of the second via 116, and a bottom surface of the third via 117.

Accordingly, the via 132 formed in the third insulating layer 130 is commonly connected with the vias 115, 116, and 117 formed in the first insulating layer 110 through the circuit pattern 114.

In other words, the vias 115, 116, 117, 124, 125, 126, 144, 145, 146 formed in the first insulating layer 110 and formed on the first insulating layer 110 have widths limited to enhance the transmission rate of an electrical signal as described above. The vias 132 and 152 formed under the first insulating layer 110 have widths wider than those of vias formed at upper layers thereof and are connected with a plurality of vias formed at upper layers thereof.

As described above, according to the embodiment, a plurality of via structures having shapes different from each other are applied to fabricate the printed circuit board. Accordingly, the fine pitch between the patterns not only can be realized, but also heat can be efficiently radiated from an electronic device.

In addition, according to the embodiment, the via structure according to the embodiment is realized using conventional equipment, so that the via structure can be formed without additional cost, and the degree of free in design can be improved.

The protective layers 160 and 170 are formed on the surfaces of the fourth and fifth insulating layers 140 and 150, respectively.

The protective layers 160 and 170 protect the surfaces of the fourth and fifth insulating layers 140 and 150 or the surfaces of the circuit patterns formed on the surfaces of the fourth and fifth insulating layers 140 and 150. The protective layers 160 and 170 may be formed in at least one layer structure using at least one of solder resist, an oxide, and gold (Au).

The electronic device 180 having a chip connector is attached onto the fourth insulating layer 140.

The electronic device 180 may include an active device formed on a bottom surface thereof with the chip connector and a passive device having a structure in which the chip connector surrounds the lateral sides of the electronic device.

The protective layer 160 is formed therein with the connection part 185 to electrically connect the chip connector of the electronic device 180 with the circuit pattern formed on the surface of the fourth insulating layer 140.

In addition, the molding layer 190 is formed on the protective layer 160 to protect the bottom surface of the electronic device 180 and the connection part 185.

According to the first embodiment, the vias formed in the intermediate insulating layer have widths different from that of the vias formed under the intermediate insulating layer. In other words, the fine pitches can be realized between the upper vias in order to enhance the transmission rate of the signal, and the lower vias have a large area in order to enhance heat radiation efficiency.

Therefore, according to the printed circuit board of the embodiment, not only can the fine pitch be realized in order to enhance the transmission rate of a signal, but also a large area via is employed in order to enhance heat radiation efficiency.

FIGS. 3 to 11 are sectional views to explain a method of fabricating the printed circuit board according to the first embodiment shown in FIG. 2 in a process sequence.

Figure 3:
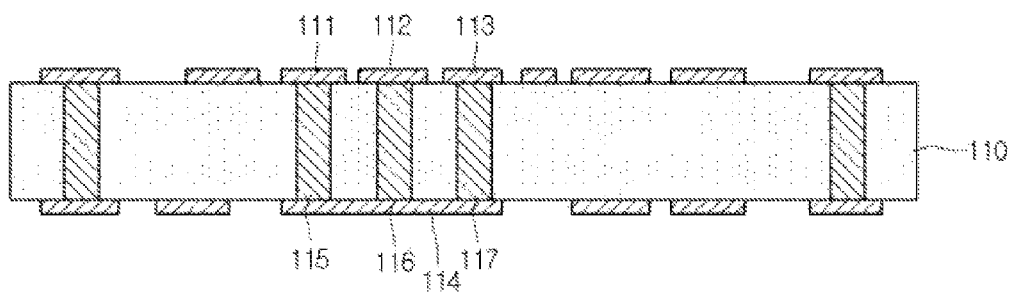
FIGS. 3 to 11 are sectional views to explain a method of fabricating the printed circuit board according to the first embodiment shown in FIG. 2 in a process sequence.

First, referring to FIG. 3, the first insulating layer 110 serving as a base to fabricate the printed circuit board is prepared.

The first insulating layer 110 may include a thermosetting or thermoplastic polymeric substrate, a ceramic substrate, an organic-inorganic composite material substrate, or a glass fiber impregnated substrate. If the insulating layer includes the polymeric resin, the insulating layer may include epoxy insulating resin. Alternatively, the insulating layer may include polyimide based resin, but the embodiment is not limited thereto.

A metallic layer (not shown) may be formed on at least one surface of the first insulating layer 110. The metallic layer is used to form the circuit patterns 111, 112, 113, and 114 to be formed on at least one surface of the first insulating layer 110.

The metallic layer may be formed by performing an electroless plating scheme with respect to the first insulating layer 110. Alternatively, the metallic layer may be formed through a copper clad laminate (CCL) scheme.

When the metallic layer is formed through the electroless plating scheme, surface roughness is formed on the surface of the base substrate 110 so that the plating process can be smoothly formed.

In addition, when the metallic layer is formed, a foaming resin (not shown) is interposed between the first insulating layer 110 and the metallic layer, so that the metallic layer may be formed on the first insulating layer 110. Accordingly, the first insulating layer 110 can be easily removed using the foaming resin in the subsequent process.

Therefore, through holes (not shown) are formed through the top surface and the bottom surface of the first insulating layer 110. The through holes are filled with a metallic material to form the first via 115, the second via 116, and the third via 117.

The first via 115, the second via 116, and the third via 117 are spaced apart from each other by a uniform distance within the first insulating layer 110.

After the first via 115, the second via 116, and the third via 117 have been formed, the circuit patterns 111, 112, and 113 connected with the first via 115, the second via 116, and the third via 117, respectively, are formed on the surface of the first insulating layer 110.

In addition, the first insulating layer 110 is formed on the bottom surface thereof with the circuit pattern 114 commonly connected with the first via 115, the second via 116, and the third via 117.

The circuit patterns 111, 112, and 113 formed on the top surface of the first insulating layer 110 are connected with mutually different vias, respectively, and the circuit pattern 114 formed on the bottom surface of the first insulating layer 110 is commonly connected with a plurality of vias.

The circuit patterns 111, 112, and 113 formed on the top surface of the first insulating layer 110 are formed with the first width, and the circuit pattern 114 formed on the bottom surface of the first insulating layer 110 is formed with the second width wider than the first width.

Meanwhile, the circuit patterns 111, 112, 113, and 114 are formed through typical processes, such as an additive process, a subtractive process, a modified semi-additive process (MSAP), and a semi-additive process, of fabricating the printed circuit board, and the details thereof will be omitted.

Figure 4:
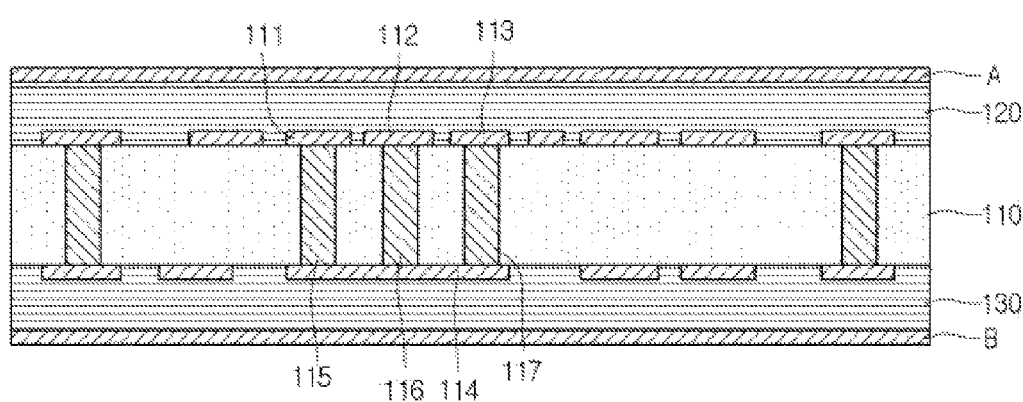

Next, referring to FIG. 4, the second insulating layer 120 is formed on the first insulating layer 110, and the third insulating layer 130 is formed under the first insulating layer 110.

Metallic layers A and B may be formed on the surfaces of the second insulating layer 120 and the third insulating layer 130.

Figure 5:
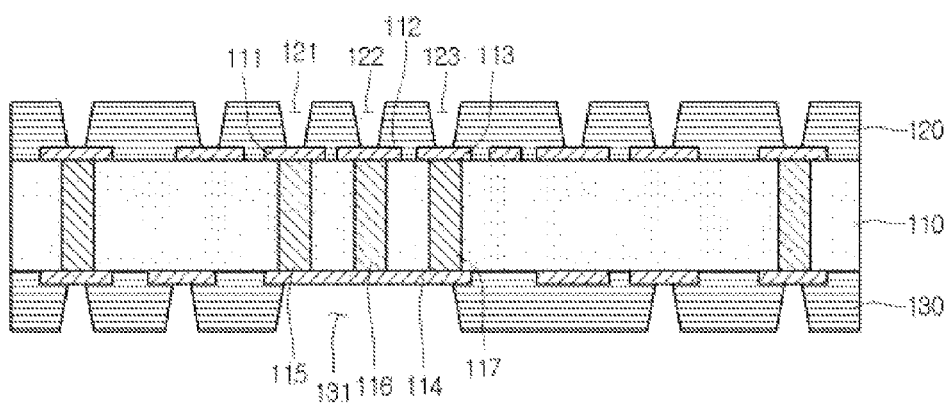

Thereafter, referring to FIG. 5, the through holes 121, 122, and 123 are formed on the second insulating layer 120 to expose the surfaces of the circuit patterns 111, 112, and 113, respectively.

In other words, the through holes include the first through hole 121 to expose the surface of the first circuit pattern 111, the second through hole 122 to expose the surface of the second circuit pattern 112, and the third through hole 123 to expose the surface of the third circuit pattern 113.

In this case, the first to third through holes 121 to 123 are formed through the second insulating layer 120 while being spaced apart from each other by a uniform distance.

The fourth through hole 131 is formed through the third insulating layer 130 to expose the surface of the circuit pattern 114.

In this case, preferably, the fourth through hole 131 is formed with a width wider than those of the first to third though holes 121 to 123.

Figure 6:
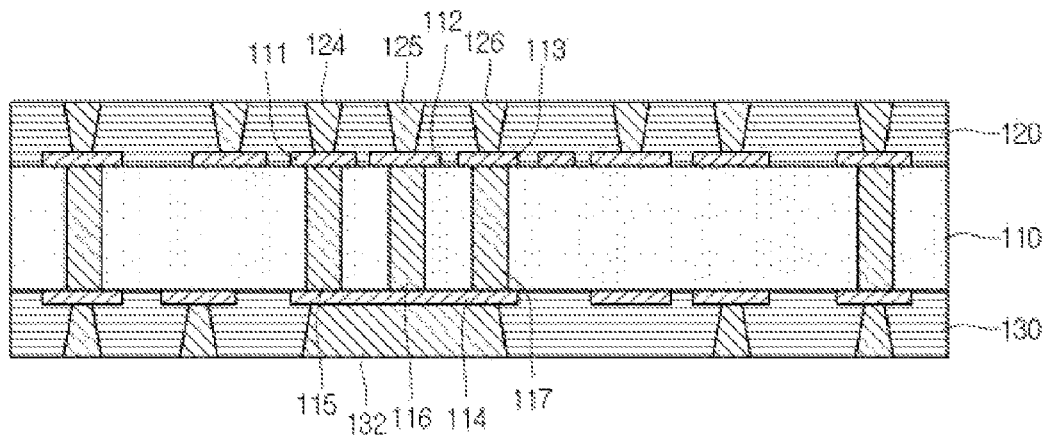

Next, referring to FIG. 6, the fourth via 124 is formed by filling a metallic material in the first through hole 121, the fifth via 125 is formed by filling a metallic material in the second through hole 122, and the sixth via 126 is formed by filling a metallic material in the third through hole 123.

In addition, the tenth via 132 is formed by filling a metallic material in the fourth through hole 121.

In this case, the fourth via 124 is connected with the first via 115, the fifth via 125 is connected with the second via 116, and the sixth via 126 is connected with the third via 117.

In other words, the tenth via 132 is connected with a plurality of vias formed at the upper layer. In detail, the tenth via 132 is commonly connected with the first via 115, the second via 116, and the third via 117 formed at the upper layer.

Accordingly, a signal (or heat) transmitted through the first via 115, the second via 116, and the third via 117 is received in the tenth via 132.

The via may include one of Cu, Ag, Sn, Au, Ni and Pd, and may be formed through any one of an electroless plating scheme, an electrolytic plating scheme, a screen printing scheme, a sputtering scheme, an evaporation scheme, an injecting scheme, and a dispensing scheme or the combination thereof.

Figure 7:
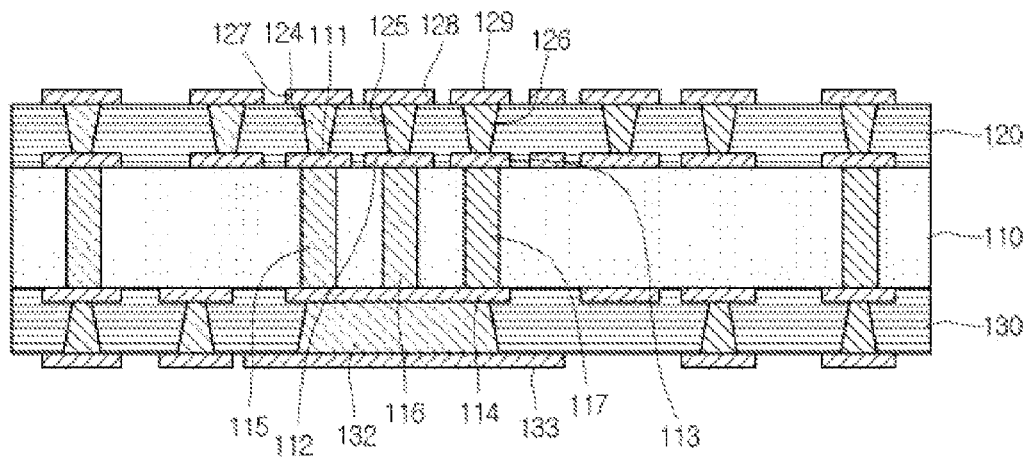

Subsequently, referring to FIG. 7, the circuit patterns 127, 128, and 129 are formed on the second insulating layer 120 so that the circuit patterns 127, 128, and 129 are connected with the fourth via 124, the fifth via 125, and the sixth via 126, respectively.

The circuit patterns 127, 128, and 129 are formed on the top surface of the second insulating layer 120 while being spaced apart from each other by a predetermined distance.

The circuit pattern 133 is formed under the third insulating layer 130 so that the circuit pattern 133 is connected with the tenth via 132. Since the circuit pattern 133 makes contact with the tenth via 132, the circuit pattern 133 is formed with a width corresponding to a width of the tenth via 132.

Similarly, the circuit patterns 127, 128, and 129 make contact with the fourth via 124, the fifth via 125, and the sixth via 126, respectively, the circuit patterns 127, 128, and 129 have widths corresponding to those of the fourth via 124, the fifth via 125, and the sixth via 126.

In this case, the first to sixth vias have widths in the range of 50 µm to 70 µm. Accordingly, the tenth via 132 may have at least the width in the range of 150 µm to 210 µm. In this case, the width of the tenth via 132 may be determined by the number of vias commonly connected with the tenth via 132. For example, if the tenth via 132 is connected with two vias formed at the upper layer, the tenth via 132 may have at least the width in the range of 100 µm to 140 µm. In this case, since the two vias are spaced apart from each other by a predetermined distance, the width of the tenth via may be more increased actually.

Figure 8:
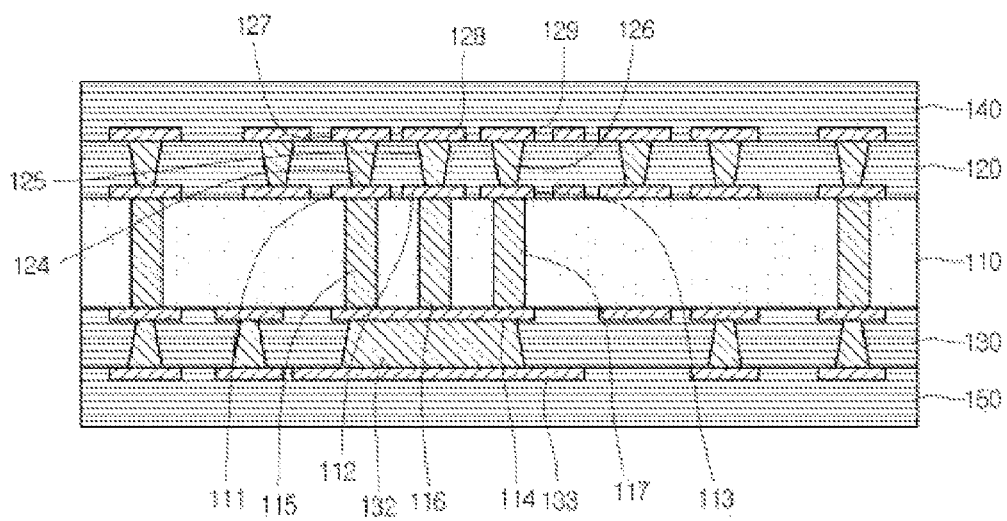

Next, referring to FIG. 8, the fourth insulating layer 140 is formed on the second insulating layer 120, and the fifth insulating layer 150 is formed under the third insulating layer 130.

Figure 9:
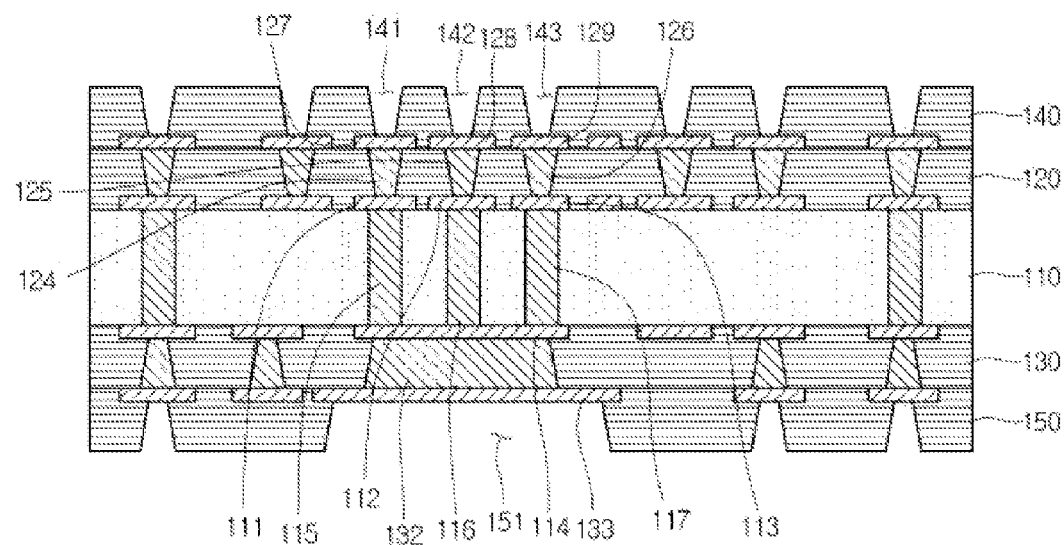

Subsequently, referring to FIG. 9, the through holes 141, 142, and 143 are formed in the fourth insulating layer 140 to expose the surfaces of the circuit patterns 127, 128, and 129.

In other words, the through hole includes the fifth through hole 141 to expose the surface of the circuit pattern 127, the sixth hole 142 to expose the surface of the circuit pattern 128, and the seventh through hole 143 to expose the surface of the circuit pattern 129.

In this case, the fifth through hole 141 to the seventh through hole 143 are formed through the fourth insulating layer 140 while being spaced apart from each other by a predetermined distance.

In addition, the eighth through hole 152 is formed in the fifth insulating layer 150 to expose the surface of the circuit pattern 133.

In this case, preferably, the eighth through hole 151 has a width wider than those of the fifth through hole 141, the sixth through hole 142, and the seventh through hole 143.

Figure 10:
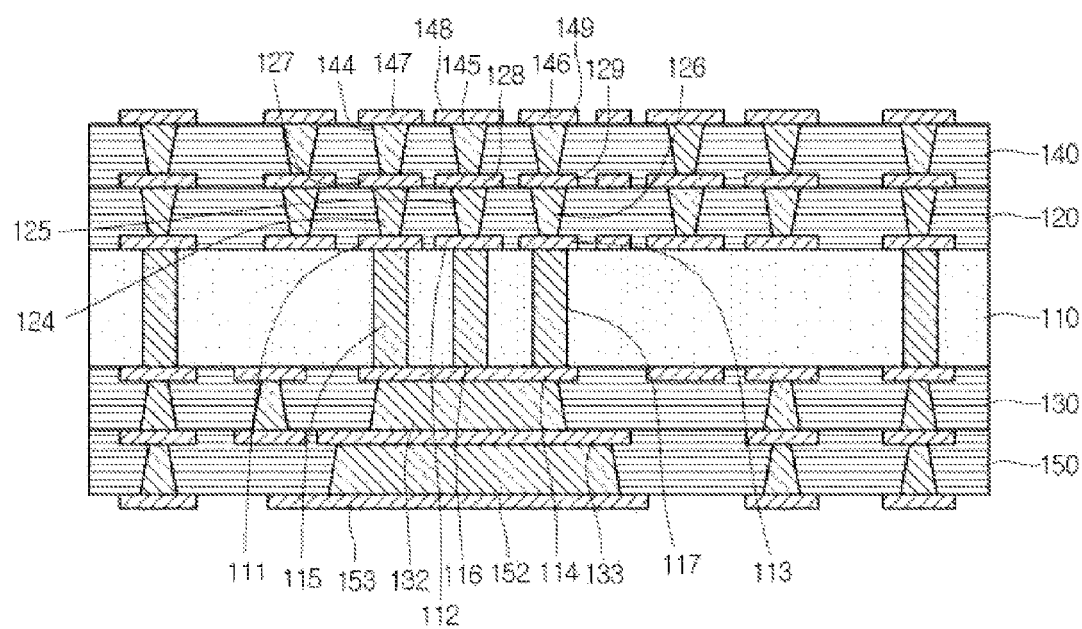

Next, referring to FIG. 10, the seventh via 144 is formed by filling a metallic material in the fifth through hole 141, the eighth via 145 is formed by filling a metallic material in the sixth through hole 142, and the ninth via 146 is formed by filling a metallic material in the seventh through hole 143.

In addition, the eleventh via 152 is formed by filling a metallic material in the eighth through hole 151 that has been formed.

In this case, the seventh via 144 is connected with the fourth via 124, and the eighth via 145 is connected with the fifth via 125. The ninth via 146 is connected with the sixth via 126.

In addition, the eleventh via 152 is formed at the upper layer, and connected with the tenth via 132 connected with a plurality of vias.

The eleventh via 152 has a width wider than that of the tenth via 132. Accordingly, the tenth via 132 and the eleventh via 152 may be formed in a pyramid shape.

The vias may include one selected from the group consisting of Cu, Ag, Sn, Au, Ni and Pd, and may be formed through any one of an electroless plating scheme, an electrolytic plating scheme, a screen printing scheme, a sputtering scheme, an evaporation scheme, an injecting scheme, and a dispensing scheme or the combination thereof.

Next, the circuit patterns 147, 148, and 149 are formed on the fourth insulating layer 150 so that the circuit patterns 147, 148, and 149 are connected with the seventh via 144, the eighth via 145, and the ninth via 146, respectively.

The circuit patterns 147, 148, and 149 are formed on the top surface of the fourth insulating layer 140 while being spaced apart from each other by a predetermined distance.

In addition, the circuit pattern 153 is formed under the fifth insulating layer 150 so that the circuit pattern 153 is connected with the eleventh via 152. Since the circuit pattern 153 makes contact with the eleventh via 152, the circuit pattern 153 has a width corresponding to that of the eleventh via 152.

Similarly, since the circuit patterns 147, 148, and 149 make contact with the seventh via 144, the eighth via 145, and the ninth via 146, respectively, the circuit patterns 147, 148, and 149 have widths corresponding to widths of the seventh via 144, the eighth via 145, and the ninth via 146.

Figure 11:
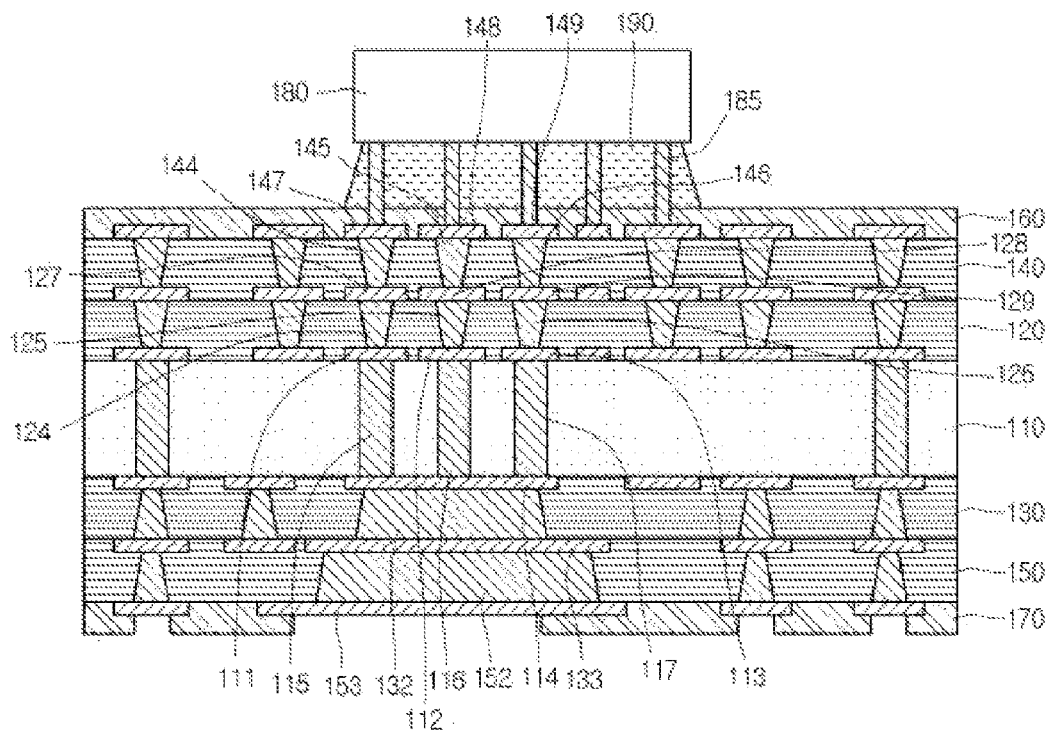

Next, referring to FIG. 11, the first protective layer 160 is formed on the fourth insulating layer 140, and the second protective layer 170 is formed under the fifth insulating layer 150.

The first and second protective layers 160 and 170 protect the surfaces of the fourth and fifth insulating layers 140 and 150 or the surfaces of the circuit patterns formed on the surfaces of the fourth and fifth insulating layers 140 and 150. The first and second protective layers 160 and 170 may be formed in at least one layer structure using at least one of solder resist, an oxide, and gold (Au).

The first and second protective layers 160 and 170 have openings to open the surfaces of the circuit patterns to be exposed to the outside.

The first electronic device 180 is attached onto the first protective layer 160.

A plurality of connection parts 185 are formed in the first protective layer 160. The connection parts 185 are connected with the circuit patterns formed on the surface of the fourth insulating layer 140. Accordingly, the connection parts 185 electrically connect chip connectors formed on the circuit patterns and the first electronic device 180 with each other.

The molding layer 185 is formed at a peripheral portion of the first electronic device 180.

As described above, according to the embodiment, a plurality of via structures having shapes different from each other are applied to fabricate the printed circuit board. Accordingly, the fine pitch between the patterns not only can be realized, but also heat can be efficiently radiated from an electronic device.

In addition, according to the embodiment, the via structure according to the present embodiment is realized using conventional equipment, so that the via structure can be formed without additional cost, and the degree of free in design can be improved when the via structure is realized.

Figure 12:
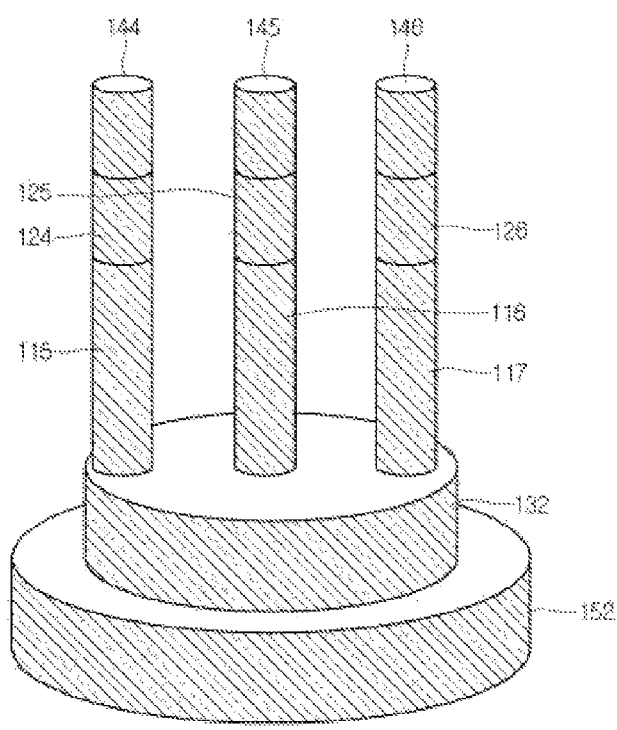
FIG. 12 is a view to explain a via structure according to the first embodiment.

FIG. 12 is a view to explain a via structure according to the first embodiment.

In the via structure, small vias formed on the base insulating layer are distinguished from large vias formed under the base insulating layer.

In other words, the first to third vias 115, 116, and 117 are formed in the base insulating layer.

The fourth to sixth vias 124, 125, and 126 connected with the first to third vias 115, 116, and 117 are formed on the base insulating layer.

Other seventh to ninth vias 144, 145, and 146 connected with the fourth to sixth vias 124 to 126 are formed on the fourth to sixth vias 124 to 126.

Meanwhile, one tenth via 132 commonly connected with the first to third vias 115, 116, and 117 is formed under the base insulating layer.

In this case, since the tenth via 132 is commonly connected with the first to third vias 115, 116, and 117, the tenth via 132 has a width wider than at least the sum of the widths of the first to third vias 115, 116, and 117.

In other words, one via 132 is a large via.

In addition, the eleventh via 152 is formed under the tenth via 132. In this case, the eleventh via 152 has a width wider than that of the tenth via 132.

Accordingly, the tenth via 132 and the eleventh via 152 have a pyramid shape.

Figure 13:
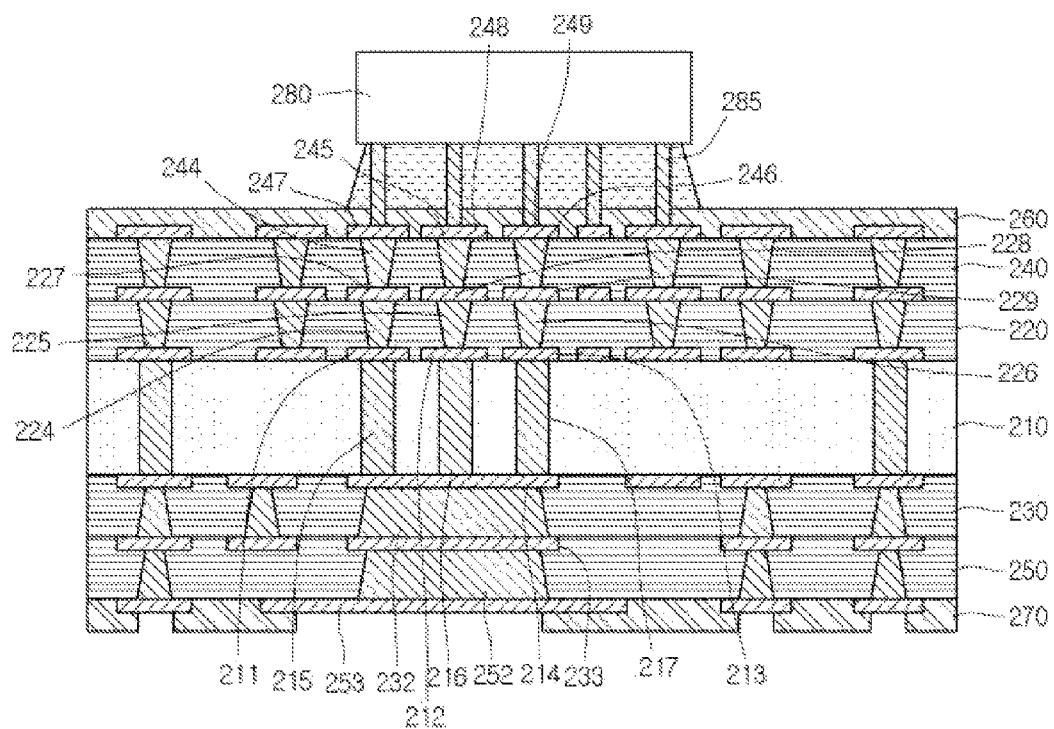
FIG. 13 is a sectional view showing a printed circuit board according to a second embodiment.

FIG. 13 is a sectional view showing a printed circuit board according to a second embodiment.

Hereinafter, the structure of a printed circuit board according to the second embodiment will be described based on the printed circuit board according to the first embodiment.

The same portion of the structure of the printed circuit board according to the first embodiment as the structure of the printed circuit board according to the second embodiment will not be further described.

Referring to FIG. 13, the printed circuit board includes insulating layers 210, 220, 230, 240, and 250, vias 215, 216, 217, 224, 225, 226, 244, 245, 246, 232, and 252, protective layers 260 and 270, an electronic device 280, and a connection part 285.

The first insulating layer 210, the second insulating layer 220, the third insulating layer 230, the fourth insulating layer 240, and the fifth insulating layer 250 may include an insulating plate, and may include a thermosetting or thermoplastic polymeric substrate, a ceramic substrate, an organic-inorganic composite material substrate, or a glass fiber impregnated substrate. If the insulating layers include the polymeric resin, the insulating layers may include epoxy insulating resin, such as FR-4, Bismaleimide Triazine (BT), or Ajinomoto Build up Film (ABF). Alternatively, the insulating layers may include polyimide based resin, but the embodiment is not limited thereto.

The circuit patterns 211, 212, 213, 214, 227, 228, 229, 247, 248, 249, 233, and 253 are formed on the surface of the insulating layers 210, 220, 230, 240, and 250.

The circuit patterns 211, 212, 213, 214, 227, 228, 229, 247, 248, 249, 233, and 253 may be connected with the vias 215, 216, 217, 224, 225, 226, 244, 245, 246, 232, and 252.

The circuit patterns 211, 212, 213, 214, 227, 228, 229, 247, 248, 249, 233, and 253 may have mutually different widths varying depending on positions where the circuit patterns 211, 212, 213, 214, 227, 228, 229, 247, 248, 249, 233, and 253 are formed.

Preferably, the circuit patterns 211, 212, 213, 227, 228, 229, 247, 248, and 249 formed on the first insulating layer 210 may have a first width, and the circuit patterns 214, 233, and 253 formed under the first insulating layer 210 may have a second width wider than the first width.

This is because the circuit patterns 211, 212, 213, 227, 228, 229, 247, 248, and 249 formed on the first insulating layer 210 may have functions different from those of the circuit patterns 214, 233, and 253 formed under the first insulating layer 210. Alternatively, this is because the circuit patterns must make efficiencies different from each other.

In other words, the circuit patterns 211, 212, 213, 227, 228, 229, 247, 248, and 249 formed on the first insulating layer 210 have the first width in order to realize the fine pitches while enhancing the efficiency of an electrical signal transmission rate. In addition, the circuit patterns 214, 233, and 253 formed under the first insulating layer 210 have a second width wider than the first width in order to enhance heat radiation efficiency.

The vias 215, 216, 217, 224, 225, 226, 244, 245, 246, 232, and 252 are formed through the insulating layers 210, 220, 230, 240, and 250.

The vias 215, 216, 217, 224, 225, 226, 244, 245, 246, 232, and 252 formed through the insulating layers 210, 220, 230, 240, and 250 are connected with the circuit patterns formed on the surfaces of the relevant insulating layers.

Similarly to the circuit patterns 211, 212, 213, 214, 227, 228, 229, 247, 248, 249, 233, and 253, the vias 215, 216, 217, 224, 225, 226, 244, 245, 246, 232, and 252 may have mutually different widths depending on positions where the vias 215, 216, 217, 224, 225, 226, 244, 245, 246, 232, and 252 are formed.

In other words, the vias 224, 225, 226, 244, 245, and 246 formed above the first insulating layer 210 and the vias 215, 216, and 217 formed in the first insulating layer 210 have a third width, and the vias 232 and 252 formed under the first insulating layer 210 have a fourth width wider than the third width.

The via 252 formed in the fifth insulating layer 252 has a width equal to that of the via 232 formed in the third insulating layer 230. Accordingly, the vias 252 and 232 may have a rod-type column shape.

In this case, the via 232 formed in the third insulating layer 230 is commonly formed with a plurality of vias formed on upper layers.

In other words, the via 232 formed in the third insulating layer 230 is commonly connected with the vias 215, 216, and 217 formed in the first insulating layer 210. Accordingly, the via 232 formed in the third insulating layer 230 has a width wider than the sum of the widths of the vias 215, 216 and 217 formed in the first insulating layer 210.

The vias 215, 216, 217, 224, 225, 226, 244, 245, and 246 formed in the first insulating layer 210 and on the first insulating layer 210 have limited widths in order to increase the transmission rate of an electrical signal as described above. The vias 232 and 252 formed under the first insulating layer 210 have widths wider than those of vias formed on the first insulating layer 210 in order to enhance the heat radiation efficiency and are connected with a plurality of vias formed at the upper layers.

As described above, according to the embodiment, a plurality of via structures having shapes different from each other are applied to fabricate the printed circuit board. Accordingly, the fine pitch between the patterns not only can be realized, but also heat can be efficiently radiated from an electronic device.

In addition, according to the embodiment, the via structure according to the present embodiment is realized using conventional equipment, so that the via structure can be formed without additional cost, and the degree of free in design can be improved when the via structure is realized.

The protective layers 260 and 270 are formed on the surfaces of the fourth and fifth insulating layers 240 and 250, respectively.

An electronic device 280 having a chip connector is attached to the fourth insulating layer 240.

The connection part 285 is formed in the protective layer 260 to electrically connect the chip connector of the electronic device 280 with the circuit pattern formed on the surface of the fourth insulating layer 240.

FIGS. 14 to 17 are sectional views to explain a method of fabricating the printed circuit board according to the second embodiment shown in FIG. 13 in a process sequence.

Figure 14:
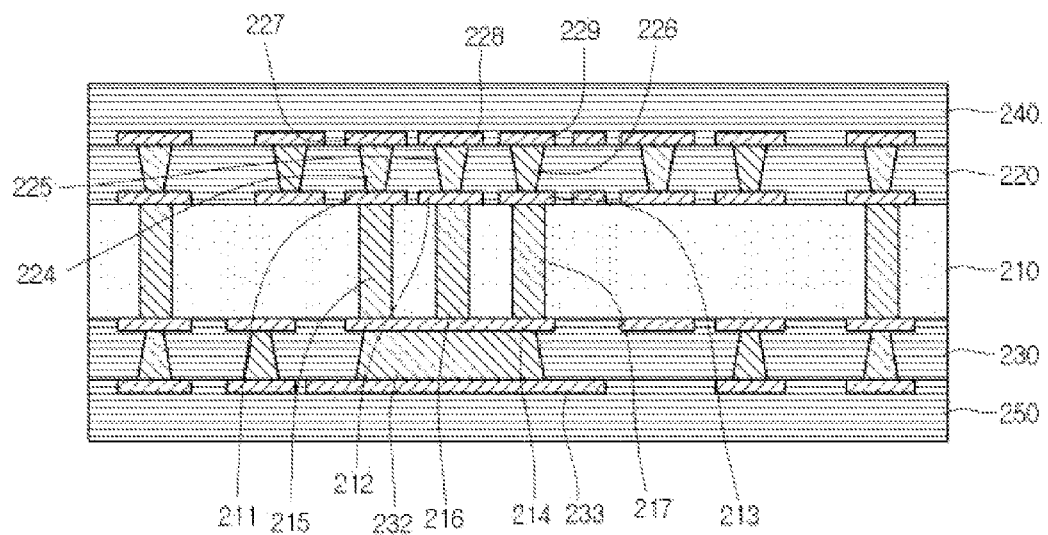
FIGS. 14 to 17 are sectional views to explain a method of fabricating the printed circuit board according to the second embodiment shown in FIG. 13 in a process sequence.

First, referring to FIG. 14, the first insulating layer 210 serving as a base to fabricate the printed circuit board is prepared.

Next, through holes (not shown) are formed through the top surface and the bottom surface of the first insulating layer 110. The through holes are filled with a metallic material to form the first via 215, the second via 216, and the third via 217.

The first via 215, the second via 216, and the third via 217 are spaced apart from each other by a uniform distance within the first insulating layer 210.

After the first via 215, the second via 216, and the third via 217 have been formed, the circuit patterns 211, 212, and 213 connected with the first via 215, the second via 216, and the third via 217, respectively, are formed on the surface of the first insulating layer 210.

In addition, the first insulating layer 210 is formed on the bottom surface thereof with the circuit pattern 214 commonly connected with the first via 215, the second via 216, and the third via 217.

The circuit patterns 211, 212, and 213 formed on the top surface of the first insulating layer 210 are connected with mutually different vias, respectively, and the circuit pattern 214 formed on the bottom surface of the first insulating layer 210 is commonly connected with a plurality of vias.

The circuit patterns 211, 212, and 213 formed on the top surface of the first insulating layer 210 are formed with the first width, and the circuit pattern 214 formed on the bottom surface of the first insulating layer 210 is formed with the second width wider than the first width.

The second insulating layer 220 is formed on the first insulating layer 210, and the third insulating layer 230 is formed under the first insulating layer 210.

Next, the fourth via 224, the fifth via 225, and the sixth via 226 are formed in the second insulating layer 220, and the tenth via 232 is formed in the third insulating layer 230.

In this case, the fourth via 224 is connected with the first via 215, and the fifth via 225 is connected with the second via 216, and the sixth via 226 is connected with the third via 217.

In addition, the tenth via 232 is connected with a plurality of vias formed on the upper layer. In other words, the tenth via 232 is commonly connected with the first via 215, the second via 216, and the third via 217 formed at the upper layer Accordingly, a signal (or heat) transmitted through the first via 215, the second via 216, and the third via 217 is received in the tenth via 232.

Subsequently, the circuit patterns 227, 228, and 229 are formed on the second insulating layer 220 so that the circuit patterns 227, 228, and 229 are connected with the fourth via 224, the fifth via 225, and the sixth via 226, respectively.

The circuit patterns 227, 228, and 229 are formed on the top surface of the second insulating layer 220 while being spaced apart from each other by a predetermined distance.

The circuit pattern 233 is formed under the third insulating layer 230 so that the circuit pattern 233 is connected with the tenth via 232. Since the circuit pattern 233 makes contact with the tenth via 232, the circuit pattern 233 is formed with a width corresponding to a width of the tenth via 232.

Next, the fourth insulating layer 240 is formed on the second insulating layer 220, and the fifth insulating layer 250 is formed under the third insulating layer 230.

Figure 15:
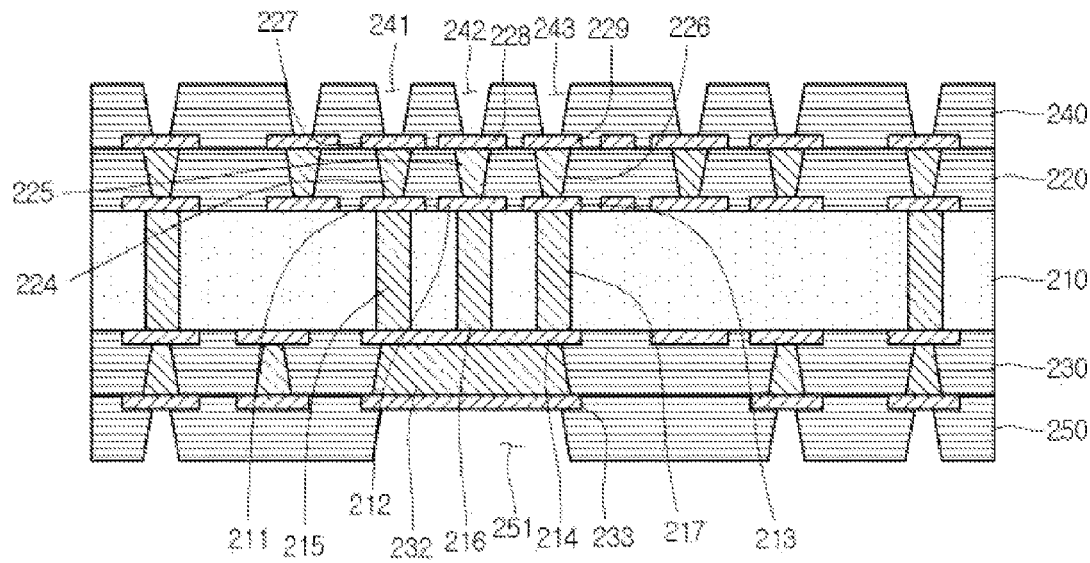

Therefore, referring to FIG. 15, the through holes 241, 242, and 243 are formed in the fourth insulating layer 240 to expose the surfaces of the circuit patterns 227, 228, and 229.

In other words, the through hole includes the fifth through hole 241 to expose the surface of the circuit pattern 227, the sixth hole 242 to expose the surface of the circuit pattern 228, and the seventh through hole 243 to expose the surface of the circuit pattern 229.

In this case, the fifth through hole 241, the sixth through hole 242, and the seventh through hole 243 are formed through the fourth insulating layer 240 while being spaced apart from each other by a predetermined distance.

In addition, the eighth through hole 251 is formed in the fifth insulating layer 250 to expose the surface of the circuit pattern 233.

In this case, preferably, the eighth through hole 251 has a width wider than those of the fifth through hole 241, the sixth through hole 242, and the seventh through hole 243.

In addition, the eighth through hole 251 has a width equal to that of a through hole formed in the second insulating layer 230 formed directly on the eight through hole 251.

Figure 16:
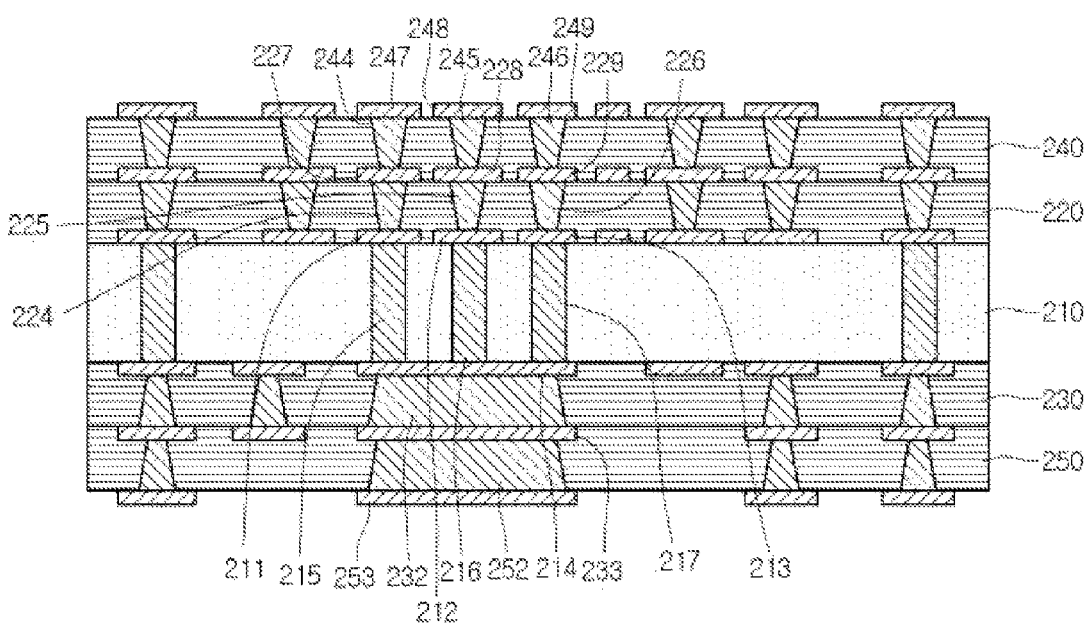

Next, referring to FIG. 16, the seventh via 244 is formed by filling a metallic material in the fifth through hole 241, the eighth via 245 is formed by filling a metallic material in the sixth through hole 242, and the ninth via 246 is formed by filling a metallic material in the seventh through hole 243.

In addition, the eleventh via 252 is formed by filling a metallic material in the eighth through hole 251 that has been formed.

In this case, the seventh via 244 is connected with the fourth via 224, and the eighth via 245 is connected with the fifth via 225. The ninth via 246 is connected with the sixth via 226.

In addition, the eleventh via 252 is formed at the upper layer, and connected with the tenth via 232 connected with a plurality of vias.

The eleventh via 252 has a width wider than that of the tenth via 232. Accordingly, the tenth via 232 and the eleventh via 252 may be formed in a rod shape.

Next, the circuit patterns 247, 248, and 249 are formed on the fourth insulating layer 250 so that the circuit patterns 247, 248, and 249 are connected with the seventh via 244, the eighth via 245, and the ninth via 246, respectively.

The circuit patterns 247, 248, and 249 are formed on the top surface of the fourth insulating layer 240 while being spaced apart from each other by a predetermined distance.

In addition, the circuit pattern 253 is formed under the fifth insulating layer 250 so that the circuit pattern 253 is connected with the eleventh via 252. Since the circuit pattern 253 makes contact with the eleventh via 252, the circuit pattern 253 has a width corresponding to that of the eleventh via 252.

Similarly, since the circuit patterns 247, 248, and 249 make contact with the seventh via 244, the eighth via 245, and the ninth via 246, respectively, the circuit patterns 247, 248, and 249 have widths corresponding to widths of the seventh via 244, the eighth via 245, and the ninth via 246.

Figure 17:
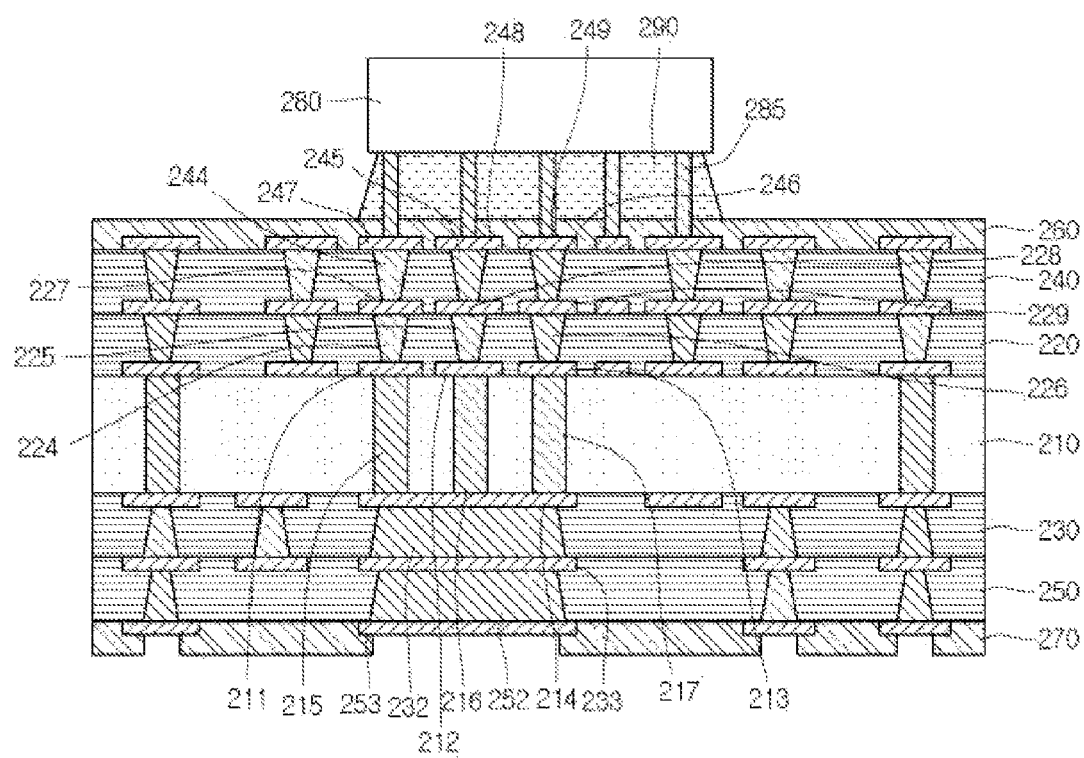

Next, referring to FIG. 17, the first protective layer 260 is formed on the fourth insulating layer 240, and the second protective layer 270 is formed under the fifth insulating layer 250.

The first and second protective layers 260 and 270 have openings to open the surfaces of the circuit patterns to be exposed to the outside.

The first electronic device 280 is attached onto the first protective layer 260.

A plurality of connection parts 285 are formed in the first protective layer 260.

As described above, according to the embodiment, a plurality of via structures having shapes different from each other are applied to fabricate the printed circuit board. Accordingly, the fine pitch between the patterns not only can be realized, but also heat can be efficiently radiated from an electronic device.

In addition, according to the embodiment, the via structure according to the embodiment is realized using conventional equipment, so that the via structure can be formed without additional cost, and the degree of free in design can be improved when the via structure is realized.

Figure 18:
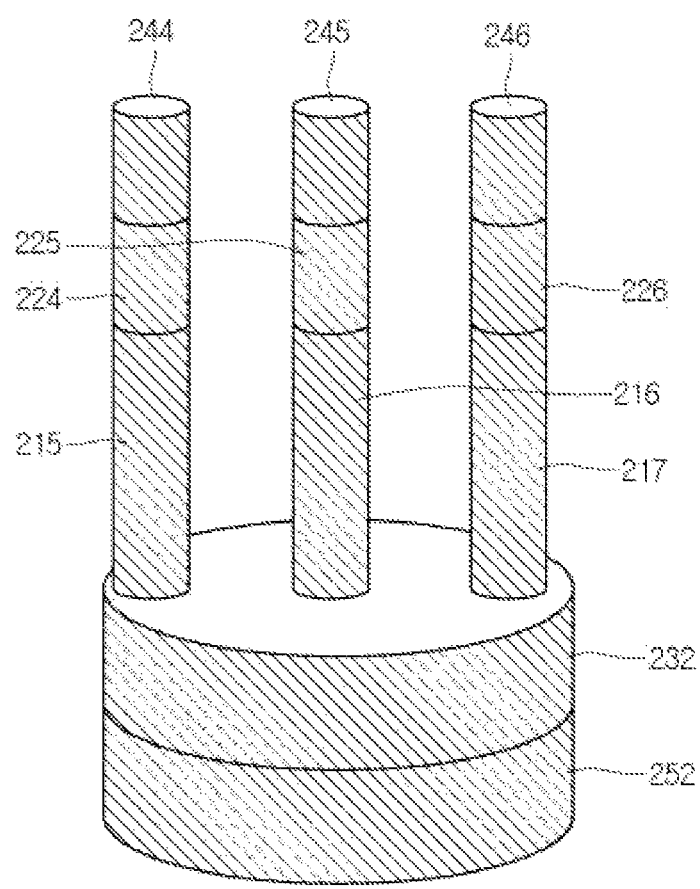
FIG. 18 is a view to explain a via structure according to the second embodiment.

FIG. 18 is a view to explain a via structure according to the second embodiment.

In the via structure, small vias formed on the base insulating layer are distinguished from large vias formed under the base insulating layer.

In other words, the first to third vias 215, 216, and 217 are formed in the base insulating layer.

The fourth to sixth vias 224, 225, and 226 connected with the first to third vias 215, 216, and 217 are formed on the base insulating layer.

Other seventh to ninth vias 244, 245, and 246 connected with the fourth to sixth vias 224 to 226 are formed on the fourth to sixth vias 224 to 226.

Meanwhile, one tenth via 232 commonly connected with the first to third vias 215, 216, and 217 is formed under the base insulating layer.

In this case, since the tenth via 232 is commonly connected with the first to third vias, the tenth via 232 has a width wider than at least the sum of the widths of the first to third vias.

In other words, one via 232 is a large via.

In addition, the eleventh via 252 is formed under the tenth via 232. In this case, the eleventh via 252 has a width wider than that of the tenth via 232.

Accordingly, the tenth via 232 and the eleventh via 252 have a rod shape.

Figure 19:
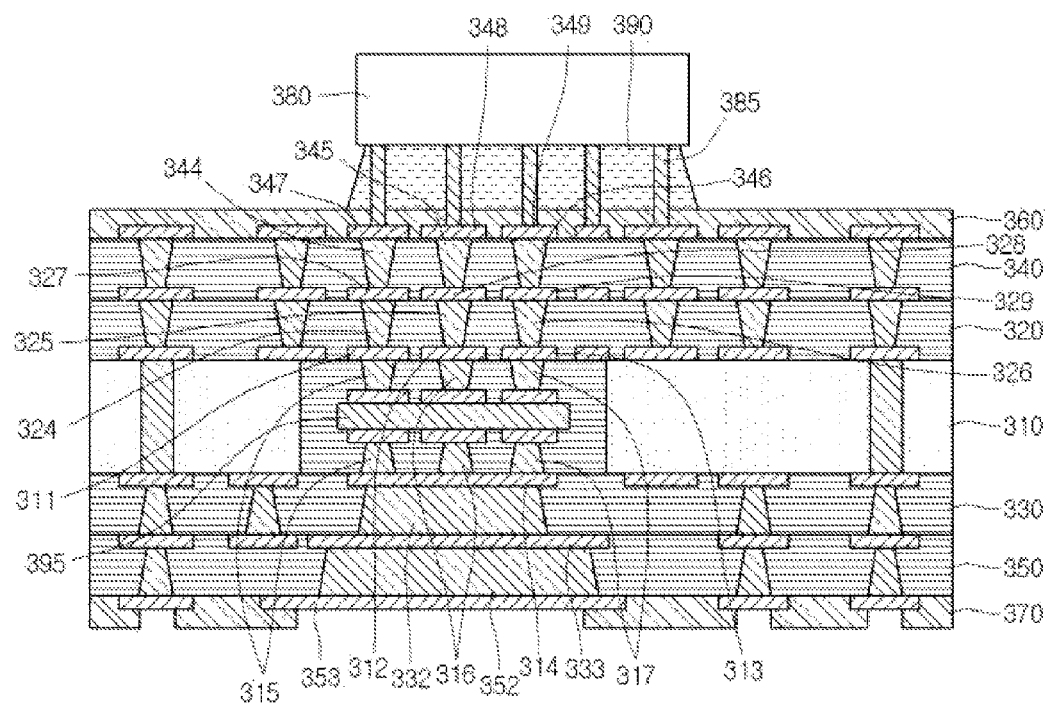
FIG. 19 is a sectional view showing the structure of a printed circuit board according to a third embodiment.

FIG. 19 is a sectional view showing a printed circuit board according to a second embodiment.

Referring to FIG. 19, the printed circuit board according to the third embodiment includes insulating layers 310, 320, 330, 340, and 350, vias 315, 316, 317, 324, 325, 326, 344, 345, 346, 332, and 352, protective layers 360 and 370, an electronic device 380, a connection part 385, a molding layer 390, and a second electronic device 395.

The printed circuit board according to the third embodiment is the same as the printed circuit board according to the first embodiment except for the internal structure of the first insulating layer 310.

Accordingly, in the following description of the printed circuit board according to the third embodiment, only the internal structure of the first insulating layer will be described below.

A cavity 400 is formed in the first insulating layer 310, so that a second electronic device 395 is formed in the cavity 400.

The second electronic device 395 may include one of an active device and a passive device.

First vias 315, second vias 316, and third vias 317 are formed on and under the second electronic device 395.

In addition, the first to third vias 315 to 317 formed on the second electronic device 385 are connected with relevant vias formed at an upper layer thereof and vertically aligned in line with the first to third vias 315 to 317, respectively.

In addition, the first to third 315 to 317 formed under the second electronic device 395 are commonly connected with one via formed at a lower layer thereof.

Figure 20:
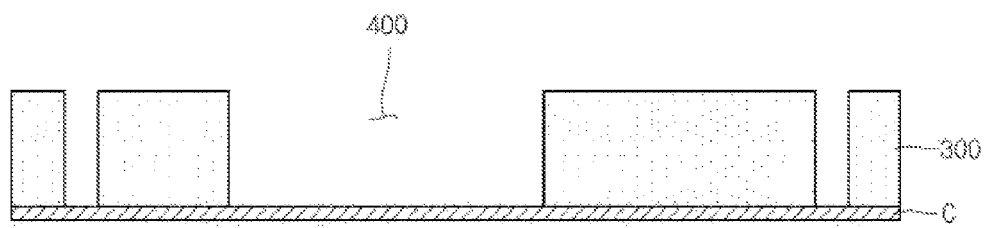
FIGS. 20 to 22 are sectional views to explain the method of fabricating the printed circuit board according to the third embodiment shown in FIG. 19 in a process sequence.
Figure 21:
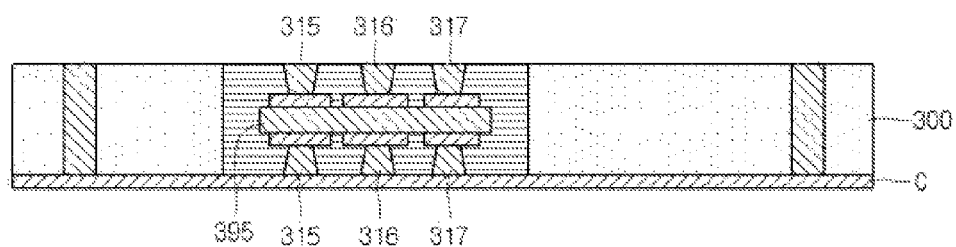
Figure 22:
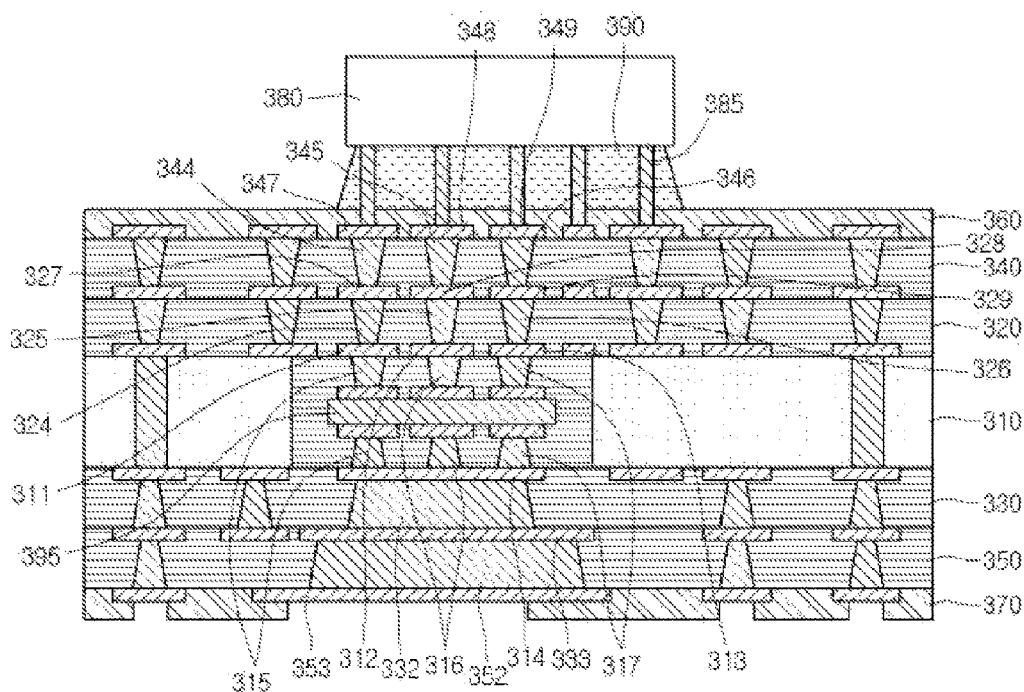

FIGS. 20 to 22 are sectional views to explain the method of fabricating the printed circuit board according to the third embodiment shown in FIG. 19 in a process sequence.

Referring to FIG. 20, the first insulating layer is prepared, and the prepared first insulating layer is machined to form the cavity 400.

A carrier C may be formed under the first insulating layer 310.

Therefore, referring to FIG. 21, an inner layer circuit including the second electronic device 395 is attached into the cavity 400.

The inner layer circuit has the first to third vias 315, 316, and 317 connected with the chip connector of the second electronic device 395 and formed on and under the second electronic device 395. The inner layer circuit includes an insulating member to surround the second electronic device 395 and the first to third vias 315, 316, and 317.

Next, after the inner layer circuit has been attached to the cavity, the carrier is removed and the subsequent process is performed accordingly to fabricate the printed circuit board shown in FIG. 22.

Since the subsequent processes have been described in detail in the description of the first embodiment, the details thereof will be omitted.

Figure 23:
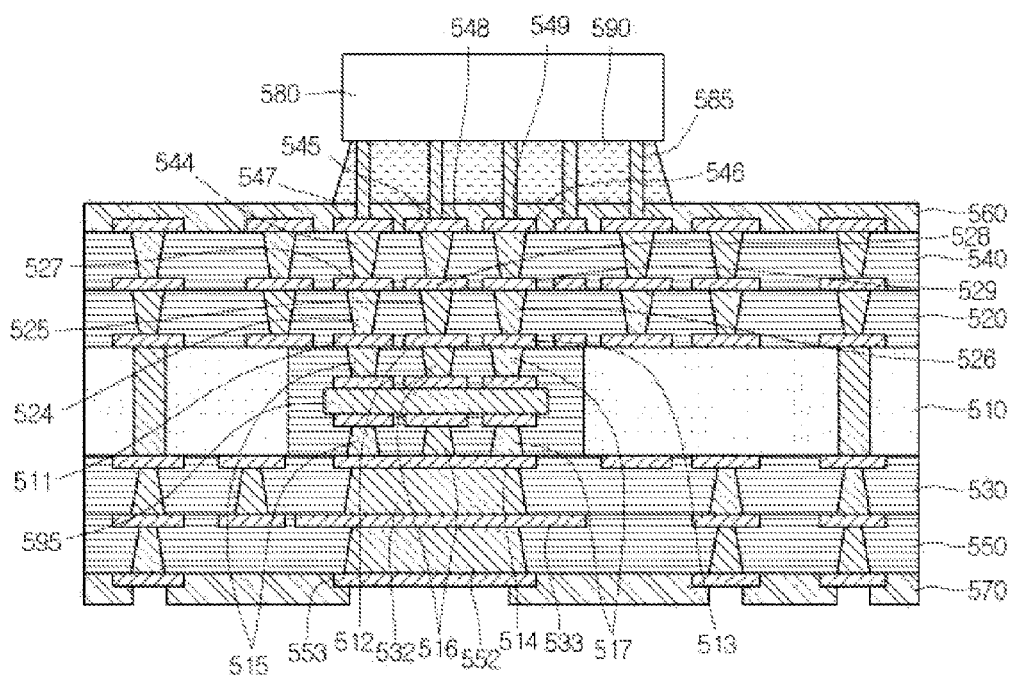
FIG. 23 is a sectional view showing the structure of a printed circuit board according to a fourth embodiment.

FIG. 23 is a sectional view showing the structure of the printed circuit board according to a fourth embodiment.

Referring to FIG. 23, the printed circuit board according to the fourth embodiment includes insulating layers 510, 520, 530, 540, and 550, vias 515, 516, 517, 524, 525, 526, 544, 545, 546, 532, and 552, printed circuit boards 511, 512, 513, 514, 527, 528, 529, 547, 548, 549, 533, and 553, protective layers 560 and 570, a first electronic device 580, a connection part 585, a molding layer 590, and a second electronic device 595.

In this case, the printed circuit board according to the fourth embodiment is the same as the printed circuit board according to the second embodiment except for the structure of the first insulating layer 510.

Accordingly, in the following description of the printed circuit board according to the fourth embodiment, only the internal structure of the first insulating layer will be described below.

The first insulating layer 510 is formed therein with a cavity, and the second electronic device 595 is formed in the cavity.

The second electronic device 595 may include one of an active device and a passive device.

The first and second vias 515, 516, and 517 are formed on and under the second electronic device 595.

In addition, the first to third vias 515 to 517 formed on the second electronic device 595 are connected with relevant vias formed at an upper layer thereof and vertically aligned in line with the first to third vias 515 to 517, respectively.

In addition, the first to third 515 to 517 formed under the second electronic device 595 are commonly connected with one via formed at a lower layer thereof.

The embodiment provides a printed circuit board having a novel structure and a method of fabricating the same.

The embodiment provides a printed circuit board having a plurality of vias having shapes different from each other and a method of fabricating the same.

Technical objects of the embodiment may not be limited to the above object and other technical objects of the embodiment will be apparent to those skilled in the art from the following description.

According to the present application, there is provided a printed circuit board including a base insulating layer, an upper insulating layer formed on the base insulating layer, and a lower insulating layer formed under the base insulating layer. The upper insulating layer has a plurality of first vias filled in the first through holes formed through top and bottom surfaces of the upper insulating layer, respectively, and the lower insulating layer has a second via filled in one second through hole formed through top and bottom surfaces of the lower insulating layer and commonly connected with the first vias.

In addition, the second via has a width wider than a width of each of the first vias.

Further, a plurality of third vias are formed in the base insulating layer through filling of a plurality of third through holes formed through a top surface and a bottom surface of the base insulating layer and connected with the first vias formed in the upper insulating layer, respectively, In addition, the second via is commonly connected with the third vias.

Further, the printed circuit board further includes an electronic device attached to the upper insulating layer, and a plurality of connection parts to electrically connect a chip connector formed at the electronic device with the first vias formed in the upper insulating layer, respectively.

In addition, the lower insulating layer includes a first lower insulating layer under the base insulating layer, and a second lower insulating layer under the first lower insulating layer. The first lower insulating layer has a first via part constituting an upper structure of the second via, and the second lower insulating layer has a second via part constituting a lower structure of the second via. The second via has a pyramid shape having a width gradually increased from an upper portion to a lower portion.

In addition, the lower insulating layer includes a first lower insulating layer under the base insulating layer, and a second lower insulating layer under the first lower insulating layer. The first lower insulating layer has a first via part constituting an upper structure of the second via, and the second lower insulating layer has a second via part constituting a lower structure of the second via. The second via has a rod shape having equal upper and lower widths.

The printed circuit board further includes an electronic device received in the base insulating layer. Each of the third vias includes a first via part formed in the base insulating layer and connected with a top surface of the electronic device, and a plurality of second via parts formed in the base insulating layer and connected with a bottom surface of the electronic device.

In addition, the first via parts are connected with the first vias formed in the upper insulating layer, respectively, and second via parts are commonly connected with one second via formed in the lower insulating layer.

Further, the printed circuit board further includes a first circuit pattern interposed between the base insulating layer and the lower insulating layer, and having a top surface commonly making contact with bottom surfaces of the third vias and a bottom surface making contact with a top surface of one second via.

In addition, the printed circuit board further includes a plurality of second circuit patterns interposed between the base insulating layer and the upper insulating layer, and having a top surface making contact with one of the first vias and a bottom surface making contact with one of the third vias.

According to the present application, there is provided a method of fabricating a printed circuit board. The method includes preparing a base insulating layer, forming an upper insulating layer having a plurality of first through holes on the base insulating layer, preparing a lower insulating layer, which is formed therein with one through hole having a width wider than a width of each of the first through holes, under the base insulating layer, forming a plurality of first vias by filling a metallic material in the first through holes, and forming a second via by filling a metallic material in the second through hole.

In addition, the preparing of the base insulating layer includes preparing the base insulating layer having a plurality of third through holes formed through top and bottom surfaces thereof and spaced apart from each other by a predetermined distance, and forming a plurality of third vias filled in the third through holes.

In addition, a region of the lower insulating layer, in which the second through hole is formed, is overlapped with a region of the upper insulating layer in which the first through holes are formed.

In addition, the second via is commonly connected with the first vias.

In addition, the third vias have lower portions commonly connected with the second via, and have upper portions connected with the first vias, respectively.

In addition, the method further includes forming a plurality of connection parts to attach an electronic device onto the upper insulating layer and to electrically connect a chip connector formed at the electronic device with the first vias formed in the upper insulating layer, respectively.

In addition, the lower insulating layer includes a first lower insulating layer under the base insulating layer, a second lower insulating layer under the first lower insulating layer, the first lower insulating layer has a first via part constituting an upper structure of the second via, and the second lower insulating layer has a second via part constituting a lower structure of the second via. The first and second via parts of the second via have one of a pyramid shape having a width gradually increased toward a lower portion from an upper portion thereof and a rod shape having equal upper and lower widths.

The method further includes burying an electronic device in the base insulating layer. The third vias includes a plurality of first via parts formed in the base insulating layer and connected with a top surface of the electronic device, and a plurality of second via parts formed in the base insulating layer and connected with a bottom surface of the electronic device.

In addition, the first via parts are connected with the first vias formed in the upper insulating layer, respectively, and the second via parts are commonly connected with one second via formed in the lower insulating layer.

Further, the method further includes forming a circuit pattern interposed between the base insulating layer and the lower insulating layer, and having a top surface making contact with bottom surfaces of the third vias and a bottom surface making contact with a top surface of one second via.

Further, the method further includes forming a plurality of circuit pattern formed between the base insulating layer and the upper insulating layer, and having a top surface making contact with one of the first vias and a bottom surface making contact with one of the third vias.

As described above, according to the embodiment, a plurality of via structures having shapes different from each other are applied to fabricate the printed circuit board. Accordingly, the fine pitch between the patterns not only can be realized, but also heat can be efficiently radiated from an electronic device.

In addition, according to the embodiment, the via structure according to the present embodiment is realized using conventional equipment, so that the via structure can be formed without additional cost, and the degree of free in design can be improved when the via structure is realized.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A printed circuit board comprising:
   a base insulating layer;
   an upper insulating layer formed on the base insulating layer and having a plurality of first through holes spaced apart from each other in a horizontal direction;
   a lower insulating layer formed under the base insulating layer and having a second through hole formed in a region overlapped with the first through holes;
   a single first circuit pattern interposed between the base insulating layer and the lower insulating layer,
   a plurality of second circuit patterns interposed between the base insulating layer and the upper insulating layer and spaced apart from each other in the horizontal direction,
   a first electronic device attached to the upper insulating layer;
   a plurality of connection parts to electrically connect a chip connector formed at the first electronic device with the first vias formed in the upper insulating layer, respectively, and
   a second electronic device embedded in the base insulating layer,
   wherein the plurality of the connection parts are spaced apart from each other in a horizontal direction,
   wherein the upper insulating layer has a plurality of first vias filled in the first through holes, respectively,
   wherein the lower insulating layer has a single second via filled in the second through hole and commonly connected with the first vias,
   wherein the base insulating layer has a plurality of third through holes spaced apart from each other in the horizontal direction, and a plurality of third vias filled in the third through holes, respectively, wherein each of the third vias comprises:
- a plurality of first via parts formed in the base insulating layer and connected with a top surface of the second electronic device, and spaced apart from each other in the horizontal direction; and
- a plurality of second via parts formed in the base insulating layer and connected with a bottom surface of the second electronic device, and spaced apart from each other in the horizontal direction, wherein first via parts of the third vias are connected with the first vias formed in the upper insulating layer, respectively, and second via parts of the third vias are commonly connected with one second via formed in the lower insulating layer, wherein a top surface of the single second via is overlapped with bottom surfaces of the first vias in the horizontal direction, wherein each of the third vias is connected with each of the first vias formed in the upper insulating layer, wherein the single second via is commonly connected with the third vias, wherein the single first circuit pattern has a top surface commonly making contact with bottom surfaces of the third vias and a bottom surface making contact with a top surface of the single second via, wherein each of the second circuit patterns has a top surface making contact with one of the first vias and a bottom surface making contact with one of the third vias, and wherein the top surface of the single first circuit pattern is overlapped with bottom surfaces of the second circuit patterns in the horizontal direction, and wherein the plurality of the first through holes are separated from each other in a horizontal direction, and wherein the plurality of the connection parts are separated from each other in a horizontal direction.

2. The printed circuit board of claim 1, wherein the second via has a width wider than a sum of widths of the first vias.

3. The printed circuit board of claim 1, wherein the lower insulating layer comprises:
- a first lower insulating layer under the base insulating layer; and
- a second lower insulating layer under the first lower insulating layer, and wherein the first lower insulating layer has a third via part constituting an upper structure of the second via, and the second lower insulating layer has a fourth via part constituting a lower structure of the second via.

4. The printed circuit board of claim 1, wherein the single first circuit pattern has a width wider than a sum of widths of the plurality of second circuit patterns.

5. The printed circuit board of claim 3, wherein the third and fourth via parts of the second via have one of a pyramid shape having a width gradually increased toward a lower portion from an upper portion thereof or a rod shape having equal upper and lower widths.

6. A method of fabricating a printed circuit board, the method comprising:
providing a base insulating layer;
forming an upper insulating layer having a plurality of first through holes on the base insulating layer, wherein the first through holes are spaced apart from each other in a horizontal direction;
forming a lower insulating layer, which is formed therein with a second through hole having a width wider than a width of each of the first through holes, under the base insulating layer;
forming a plurality of first vias by filling a metallic material in the first through holes;
forming a single second via by filling a metallic material in the second through hole;
forming a single first circuit pattern interposed between the base insulating layer and the lower insulating layer;
forming a plurality of second circuit pattern formed between the base insulating layer and the upper insulating layer,
wherein a region of the lower insulating layer, in which the second through hole is formed, is overlapped with a region of the upper insulating layer in which the first through holes are formed;
attaching a first electronic device to the upper insulating layer;
forming a plurality of connection parts to electrically connect a chip connector formed at the first electronic device with the first vias formed in the upper insulating layer, respectively;
embedding a second electronic device in the base insulating layer,
wherein the base insulating layer has a plurality of third through holes spaced apart from each in out in the horizontal direction and a plurality of third vias filled in the third through holes, respectively,
wherein a top surface of the single second via is overlapped with bottom surfaces of the first vias in the horizontal direction,
wherein the second via is commonly connected with the first vias,
wherein each of the third vias is connected with each of the first vias formed in the upper insulating layer,
wherein the single second via is commonly connected with the third vias,
wherein the single first circuit pattern has a top surface commonly making contact with bottom surfaces of the third vias and a bottom surface making contact with a top surface of the single second via,
wherein each of the second circuit patterns has a top surface making contact with one of the first vias and a bottom surface making contact with one of the third vias, and
wherein the top surface of the single first circuit pattern is overlapped with bottom surfaces of the second circuit patterns in the horizontal direction,
wherein the plurality of the connection parts are spaced apart from each other in a horizontal direction,
wherein each of the third vias comprises:
a plurality of first via parts formed in the base insulating layer and connected with a top surface of the second electronic device, and spaced apart from each other in the horizontal direction; and
a plurality of second via parts formed in the base insulating layer and connected with a bottom surface of the second electronic device, and spaced apart from each other in the horizontal direction,
wherein first via parts of the third vias are connected with the first vias formed in the upper insulating layer, respectively, and second via parts of the third vias are commonly connected with one second via formed in the lower insulating layer,
wherein the plurality of second circuit patterns are separated from each other in the horizontal direction, wherein the plurality of the first through holes are separated from each other in a horizontal direction, and wherein the plurality of the connection parts are separated from each other in a horizontal direction.

7. The method of claim 6, wherein the lower insulating layer comprises:
   a first lower insulating layer under the base insulating layer; and
   a second lower insulating layer under the first lower insulating layer, and
   wherein the first lower insulating layer has a third via part constituting an upper structure of the second via,
   the second lower insulating layer has a fourth via part constituting a lower structure of the second via, and
   the third and fourth via parts of the second via have one of a pyramid shape having a width gradually increased toward a lower portion from an upper portion thereof or a rod shape having equal upper and lower widths.

8. The method of claim 6, wherein the single first circuit pattern has a width wider than a sum of widths of the plurality of second circuit patterns.

\* \* \* \* \*